(12) United States Patent
Yang et al.

(10) Patent No.: US 7,173,305 B2
(45) Date of Patent: Feb. 6, 2007

(54) SELF-ALIGNED CONTACT FOR SILICON-ON-INSULATOR DEVICES

(75) Inventors: Fu-Liang Yang, Hsin-Chu (TW); Yee-Chia Yeo, Hsinchu (TW); Horng-Huei Tseng, Hsinchu (TW); Chenming Hu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 14 days.

(21) Appl. No.: 10/409,810

(22) Filed: Apr. 8, 2003

(65) Prior Publication Data

US 2004/0203211 A1     Oct. 14, 2004

(51) Int. Cl.
   *H01L 21/336*     (2006.01)
   *H01L 29/772*     (2006.01)
(52) U.S. Cl. .................. 257/326; 257/365; 438/233; 438/672; 438/595; 438/303; 438/283
(58) Field of Classification Search ................ 438/149, 438/197, 287, 311, 479, 517, 585, 685, 933, 438/233, 672, 595, 303, 283, FOR. 196, 438/326; 257/55, 347, 903, 326, 365
See application file for complete search history.

(56) References Cited

U.S. PATENT DOCUMENTS

| 5,670,404 | A | 9/1997 | Dai |
| 6,252,284 | B1 | 6/2001 | Muller et al. |
| 6,391,695 | B1 | 5/2002 | Yu |
| 6,391,782 | B1 | 5/2002 | Yu |
| 6,413,802 | B1 | 7/2002 | Hu et al. |
| 6,451,708 | B1 | 9/2002 | Ha |
| 6,514,828 | B2 * | 2/2003 | Ahn et al. .................. 438/297 |
| 6,759,712 | B2 * | 7/2004 | Bhattacharyya .............. 257/347 |
| 2002/0155689 | A1 * | 10/2002 | Ahn et al. .................. 438/592 |
| 2003/0215988 | A1 * | 11/2003 | Zahurak et al. ............. 438/157 |
| 2004/0038461 | A1 * | 2/2004 | Lee et al. .................... 438/142 |

OTHER PUBLICATIONS

S. Wolf, Silicon Processing for the VLSI Era, vol. 2, p. 193.*
Huang et al. "Sub-50 nm P-Channel FinFET," IEEE Transactions on Electron Devices, vol. 48, No. 5, May 2001, pp. 880-886.
Yang et al. "35nm CMOS FinFETs," 2002 Symposium on VLSI Technology Digest of Technical Papers, 2002, pp. 104-105.
Wong, "Beyond the Conventional Transistor," IBM J. Res. & Dev., vol. 46, No. 2/3, Mar./May 2002, pp. 133-168.
Chau et al. "Advanced Depleted-Substrate Transistors: Single-gate, Double-gate and Tri-gate", Extended Abstracts of the 2002 International Conference on Solid State Devices and Materials, Nagoya, Japan, 2002, pp. 68-69.

(Continued)

*Primary Examiner*—George Fourson
(74) *Attorney, Agent, or Firm*—Haynes and Boone, LLP

(57) ABSTRACT

A method for forming a self-aligned contact to an ultra-thin body transistor first providing an ultra-thin body transistor with source and drain regions operated by a gate stack; forming a contact spacer on the gate stack; forming a passivation layer overlying the transistor; forming a contact hole in the passivation layer exposing the contact spacer and the source/drain regions; filling the contact hole with an electrically conductive material; and establishing electrical communication with the source/drain region.

34 Claims, 6 Drawing Sheets

OTHER PUBLICATIONS

Yang et al. "25nm CMOS Omega FETs," International Electron Devices Meeting (IEDM), Digest of Technical Papers, Dec. 2002, pp. 255-258.

Colinge et al. "Silicon-on-Insulator 'Gate-All-Around Device'", International Electron Devices Meeting (IEDM), Digest of Technical Papers, Dec. 1990, pp. 595-598.

Leobandung et al. "Wire-channel and wrap-around-gate metal-oxide-semiconductor field-effect transistors with a significant reduction of short channel effects", J. Vac. Sci. Technology B, vol. 15, No. 6, Nov./Dec. 1997, American Vacuum Society, pp. 2791-2794.

* cited by examiner

SELF-ALIGNED CONTACT FOR SILICON-ON-INSULATOR DEVICES

FIELD OF THE INVENTION

The present invention generally relates to the field of semiconductor devices and more particularly, to the manufacture of advanced metal oxide semiconductor field effect transistors (MOSFETs) with self-aligned contacts.

BACKGROUND OF THE INVENTION

Transistor scaling has provided continued improvement in speed performance and circuit density in ultra-large scale integrated (ULSI) chips over the past few decades. As the gate length of the conventional bulk metal-oxide-semiconductor field-effect transistor (MOSFET) is reduced, it suffers from problems related to the inability of the gate to substantially control the on and off states of the channel. Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-30 nm regime, the requirements for body doping concentration, gate oxide thickness, and source/drain (S/D) doping profiles become increasingly difficult to meet in conventional device structures where bulk silicon substrates are employed.

A promising approach to control short-channel effects and to sustain the historical pace of scaling is to use alternative device structures such as ultra-thin body transistors and multiple-gate transistors. An ultra-thin body (UTB) transistor has a body thickness that is less than half the gate length. In an ultra-thin body transistor, all current paths between the source and drain are in close proximity to the gate, resulting in good gate control of the channel potential. Multiple-gate transistor structures include the double-gate structure, triple-gate structure, omega-FET structure, and the surround-gate or wrap-around gate structure. A multiple-gate transistor structure is expected to extend the scalability of CMOS technology beyond the limitations of the conventional bulk MOSFET and realize the ultimate potential of silicon MOSFETs. The introduction of additional gates improves the capacitance coupling between the gates and the channel, increases the control of the channel potential by the gate, helps to suppress short channel effects, and prolongs the scalability of the MOS transistor.

In the above-mentioned nanoscale device structures (including UTB transistors and multiple-gate transistors), the high current density flowing in the devices means that series resistances are an important consideration in the optimization of device performance. In addition, variations in the series resistance in the source and drain regions of the device result in significant variations in the electrical characteristics of the device. A manufacturable process needs to have an adequate robustness to ensure that variations in the device series resistance are kept to a minimum.

For illustration purposes, an advanced device structure such as an ultra-thin body (UTB) transistor is first considered. FIG. 1A shows an enlarged, plane view of the UTB transistor 10. FIG. 1B shows an enlarged, cross-sectional view through the dashed line A–A' of FIG. 1A. The UTB transistor 10 comprises an ultra-thin body 12 overlying an insulator layer 14 and a silicon substrate 30. A transistor with a source 16 and a drain 18 separated by a gate electrode 20 is formed on the ultra-thin body 12. The gate electrode 20 is further insulated by a spacer 32 and a gate dielectric layer 34. A silicide layer 22 is formed in the source and drain regions 16,18. Electrical connections to the source and drain regions 16,18 are formed by conductive contacts 24,26 to the silicided contact area 22. Electrical current flowing from the source contact 24 to the drain contact 26 passes from source contact 24 into the silicided contact area 22 in the source, enters the source region 16, the channel region 28 of the transistor 10, and into the drain region 18. The current then flows from the drain region 18 to the silicided contact area 22 in the drain region 18 to the drain contact 26. The current encounters resistances in various parts of the transistor 10 as mentioned above. In an actual manufacturing process, the conductive contacts 24,26 may be misaligned.

Referring now to FIG. 2, an example of a misaligned contact is illustrated. In this example, both the source and the drain contacts 24,26 are misaligned to the right. Consequently, the distance between the source contact 24 and the channel region 28 is reduced, while the distance between the drain contact 26 and the channel region 28 is increased. This results in a reduced source resistance and an increased drain resistance. Such variations in the source and drain resistances in the transistor 40 results in variations in the device characteristics.

It is therefore an object of the present invention to provide a self-aligned contact hole for nanoscale silicon-on-insulator (SOI) devices.

It is another object of the present invention to provide a method for forming nanoscale SOI devices with self-aligned source and drain contacts.

SUMMARY OF THE INVENTION

In accordance with the present invention, a method for forming a self-aligned contact to an ultra-thin body transistor and the contact thus formed are disclosed.

In a preferred embodiment, a method for forming a self-aligned contact to an ultra-thin body transistor can be carried out by the operating steps of providing an ultra-thin body transistor including a source region and a drain region separated by a gate stack; forming a contact spacer on the gate stack; forming a passivation layer overlying the ultra-thin body transistor; forming a contact hole in the passivation layer exposing the contact spacer and the source/drain region; and filling the contact hole with an electrically conductive material for establishing electrical communication with the source/drain region.

In the method for forming a self-aligned contact to an ultra-thin body transistor, the gate stack may be a gate electrode which may be formed of a material of poly-crystalline silicon or poly-crystalline silicon-germanium. The gate electrode may be formed of a refractory metal. The gate stack may include a gate electrode and a gate capping layer, wherein the gate capping layer may be a dielectric material, or silicon nitride. The gate capping layer may further be a silicon nitride layer overlying a silicon oxide layer.

The contact spacer may be a dielectric material, may be a silicon nitride, or may be a composite spacer. The contact spacer may have a width between about 20 angstroms and about 5000 angstroms. The passivation layer may be formed of a dielectric material, may be formed of silicon oxide, or may be formed to a thickness between about 500 angstroms and about 3000 angstroms. The electrically conductive material may be a metal, or may be a nitride of titanium nitride or tantalum nitride.

The present invention is further directed to a method for forming a self-aligned contact to a multiple-gate transistor which may be carried out by the operating steps of providing a multiple-gate transistor that includes a source region and a drain region separated by a gate stack; forming a contact spacer on the gate stack; forming a passivation layer overlying the multiple-gate transistor; forming a contact hole in the passivation layer exposing the contact spacer and the source/drain region; and filling the contact hole with an electrically conductive material for establishing electrical communication with the source/drain region.

The method for forming a self-aligned contact to a multiple-gate transistor may further include the step of providing the multiple-gate transistor in a double-gate transistor, in a triple-gate transistor, or in an omega field-effect transistor. The gate stack may be a gate electrode which may be formed by a material selected of poly-crystalline silicon or poly-crystalline silicon-germanium. The gate electrode may include a gate material such as a refractory metal. The gate stack may include a gate electrode and a gate capping layer, wherein the gate capping layer may be formed of a dielectric material, may be formed of silicon nitride, or may be formed of silicon nitride layer overlying a silicon oxide layer.

In the method for forming a self-aligned contact to a multiple-gate transistor, the contact spacer may be formed of a dielectric material, may be formed of silicon nitride, or may be formed of a composite material. The contact spacer may have a width between about 20 angstroms and about 5000 angstroms. The passivation layer may be a dielectric material, may be silicon oxide, or may have a thickness between about 500 angstroms and about 3000 angstroms. The electrically conductive material may be tungsten or may be a nitride of titanium nitride and tantalum nitride.

The present invention is further directed to a self-aligned contact device which includes an ultra-thin body transistor including a source region and a drain region separated by a gate stack; a contact spacer formed on the side of the gate stack; and an electrically conductive contact in contact with the contact spacer and in electrical communication with the source/drain region.

The self-aligned contact device may be a gate electrode, which may be formed of a material of poly-crystalline silicon or poly-crystalline silicon-germanium. The gate electrode may include a gate material of a refractory metal. The gate stack may include a gate electrode and a gate capping layer, wherein the gate capping layer may be a dielectric, silicon nitride, or a silicon nitride layer overlying a silicon oxide layer. The contact spacer may be a dielectric, silicon nitride, or a composite spacer. The contact spacer may be formed to a width between about 20 angstroms and about 5000 angstroms. The passivation layer may be formed of a dielectric or may be formed of silicon oxide. The passivation layer may be formed to a thickness between about 500 angstroms and about 3000 angstroms. The electrically conductive material may be tungsten or may be a nitride of titanium nitride or tantalum nitride.

The present invention is still further directed to a self-aligned contact device which includes a multiple-gate transistor that includes a source and a drain separated by a gate stack; a contact spacer formed on the side of the gate stack; and a conductive contact in contact with the contact spacer and in electrical communication with the source and drain.

In the self-aligned contact device, the multiple-gate transistor may be a double-gate transistor, a triple-gate transistor, or an omega field-effect transistor. The gate stack may be a gate electrode, which may be formed of poly-crystalline silicon or poly-crystalline silicon-germanium. The gate electrode may be formed of a refractory metal. The gate stack may include a gate electrode and a gate capping layer which may be formed of a dielectric, of a silicon nitride, or of a silicon nitride layer overlying a silicon oxide layer. The contact spacer may be a dielectric, may be silicon nitride, or may be a composite spacer. The contact spacer may have a width between about 20 angstroms and about 5000 angstroms. The passivation layer may be formed of a dielectric material or may be formed of a silicon oxide. The passivation layer may be formed to a thickness between about 500 angstroms and about 3000 angstroms. The electrically conductive material may be tungsten or may be a nitride of titanium nitride or tantalum nitride.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention concerns the provision of self-aligned contacts to the source and drain regions in advanced semiconductor device structures such as ultra-thin body transistors, double-gate transistors such as the finFET transistor, triple-gate transistors, and omega-FET. Transistors with two or more gates, including the double-gate transistor, the triple-gate transistor, and the omega-FET are termed "multiple-gate transistors".

Figure 1A:
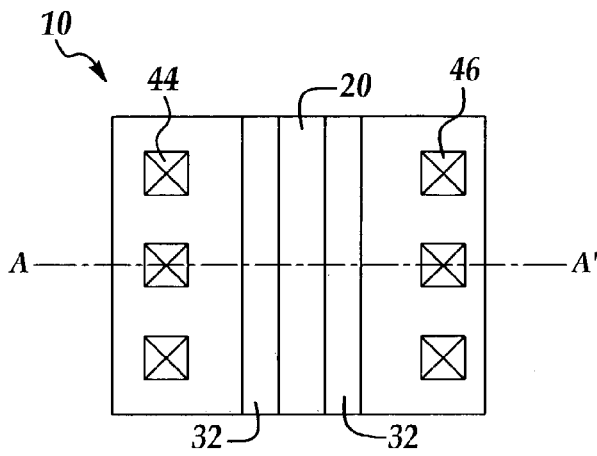
FIGS. 1A and 1B are an enlarged, plane view and an enlarged, cross-sectional view, respectively, of a conventional ultra-thin body transistor.
Figure 1B:
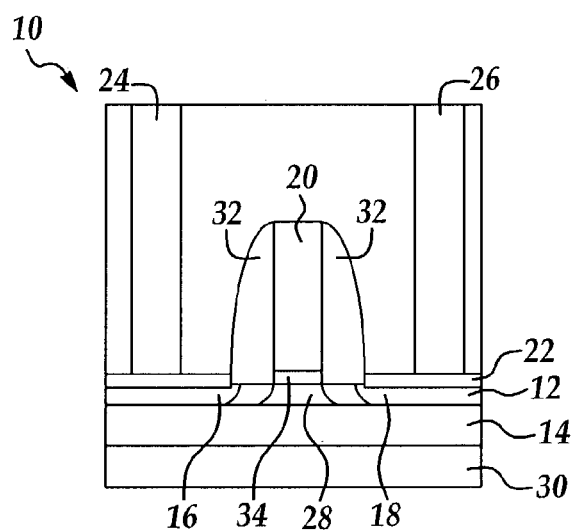
Figure 2:
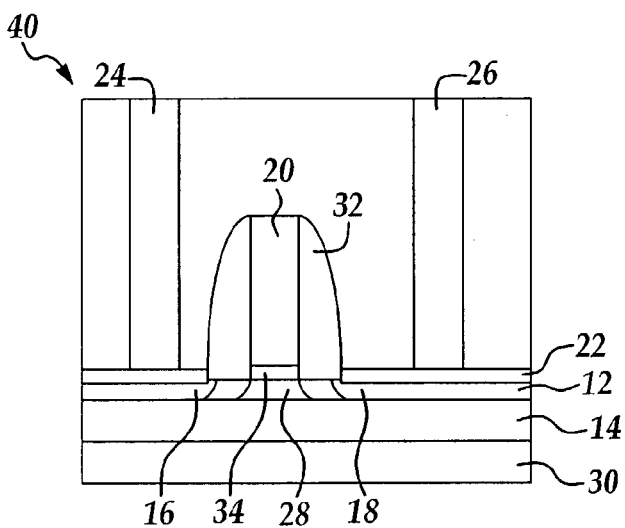
FIG. 2 is an enlarged, cross-sectional view of a conventional ultra-thin body transistor with a misaligned contact.
Figure 3A:
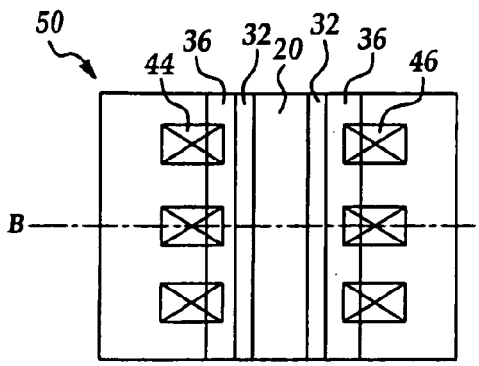
FIGS. 3A and 3B are an enlarged, plane view and an enlarged, cross-sectional view, respectively, of a present invention ultra-thin body transistor with self-aligned contact.
Figure 3B:
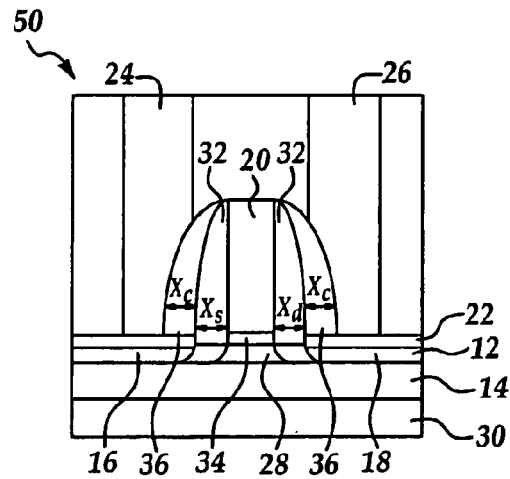

In FIG. 3A, the plane view of an improved contact scheme for the UTB transistor 50 is shown. An enlarged, cross-sectional view through the dash line B–B' of FIG. 3A is shown in FIG. 3B. The contacts 24,26 overlap a contact spacer 36, so that any slight misalignment in the source and drain contacts 24,26 will not affect the distance between the source contact 24 and the channel region 28 and the distance between the drain contact 26 and the channel region 28. The distances between the source contact 24 or the drain contact 26 and the channel region 28 are the same as long as the contact holes 44,46 overlap the contact spacer 36. The distance between the source contact 24 and the channel region 28 is labeled $X_s$, and the distance between the drain contact and the channel region is labeled $X_d$, as shown in FIG. 3B. FIG. 3B also shows the definition of the width $X_c$, of the contact spacer 36.

Figure 4A:
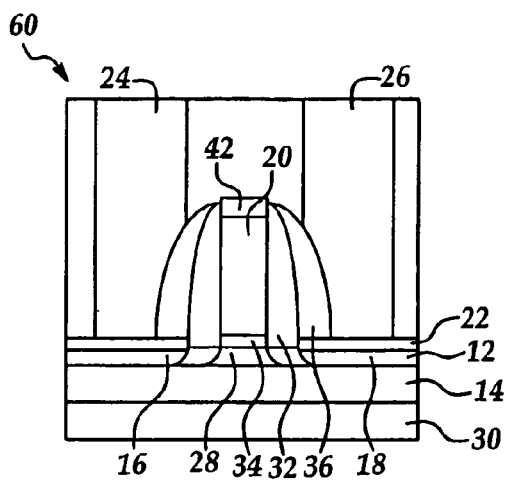
FIGS. 4A and 4B are enlarged, cross-sectional views of a present invention ultra-thin body transistor with and without a self-aligned contact, respectively.
Figure 4B:
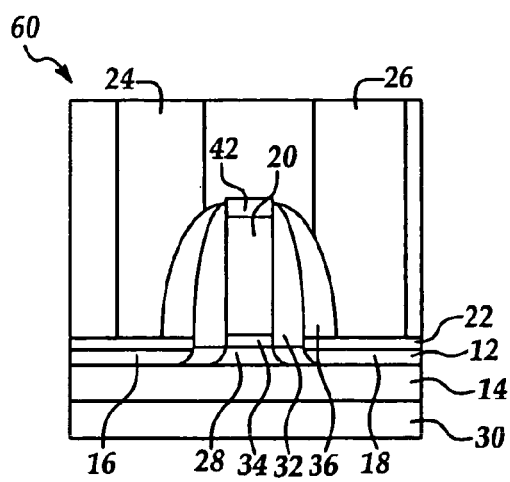

FIGS. 4A and 4B show transistor 60 in another embodiment of this invention. In FIGS. 4A and 4B, a gate capping layer 42 overlies the gate electrode 20. In this embodiment, the tolerance for the contact misalignment is larger. The provision of a mask, i.e. the gate capping layer 42, over the gate electrode 20 ensures that even if the contacts 24,26 are grossly misaligned so that one of them overlaps the gate electrode 20, an electrical short between the contacts 24,26 and the gate electrode 20 would not occur.

Figure 5A:
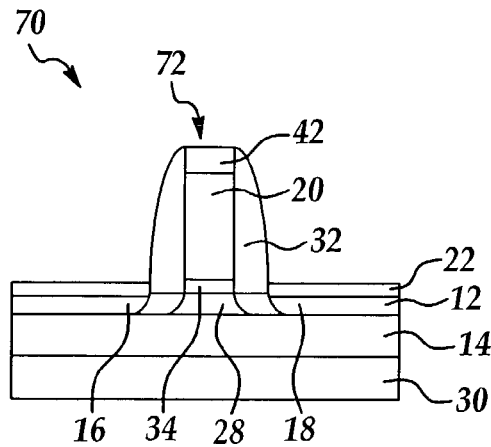
FIGS. 5A–5C are enlarged, cross-sectional views illustrating the formation process of the present invention self-aligned contact to an ultra-thin body transistor.
Figure 6A:
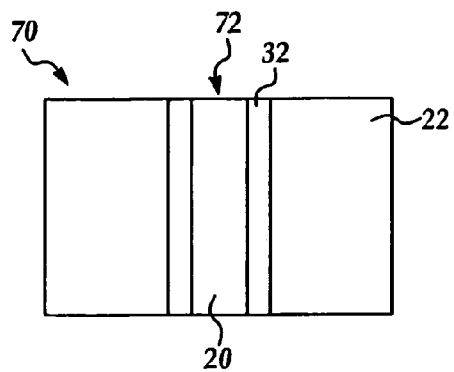
FIGS. 6A–6C are enlarged, plane views illustrating the formation of the present invention self-aligned contact to an ultra-thin body transistor.

A method for the fabrication of the present invention UTB transistor with self-aligned contact is now described. Referring now to FIGS. 5A and 6A, a UTB transistor 70 is first formed. At this stage, the UTB transistor 70 comprises a source 16 and a drain 18 separated by a gate stack 72. The gate stack 72 comprises a gate electrode 20. The gate electrode 20 is formed of a gate material. The gate material may be polycrystalline-silicon (poly-Si), poly-crystalline silicon-germanium (poly-SiGe), a refractory metal such as molybdenum and tungsten, compounds such as titanium nitride, or other suitable conducting material. In the preferred embodiment, a gate capping layer 42 is provided on the gate electrode 20. The gate stack 72 therefore comprises the gate capping layer 42 and the gate electrode 20, as shown in an enlarged, plane view of FIG. 6A. The gate capping layer 42 may be formed of a dielectric material such as silicon oxide, silicon nitride, or any other suitable material that is insulating in nature. The gate capping layer 42 may also be formed of a silicon nitride layer overlying a silicon oxide layer.

Figure 5B:
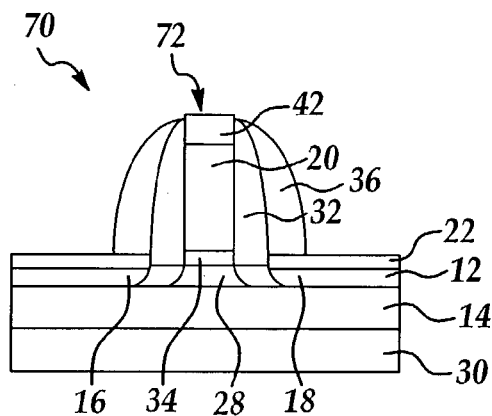
Figure 5C:
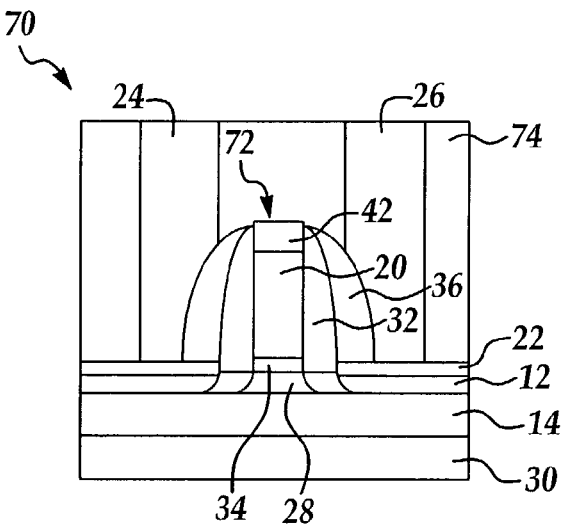
Figure 6B:
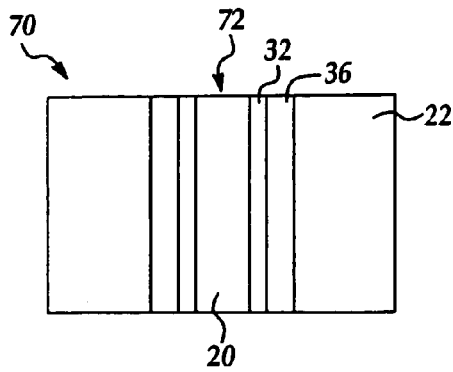
Figure 6C:
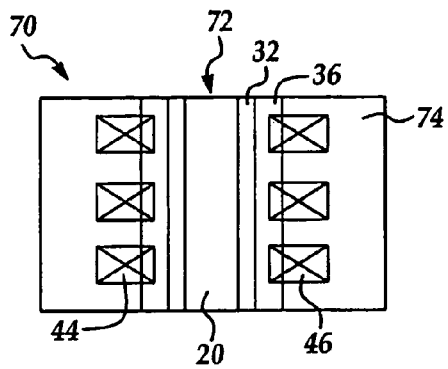

Shown in FIGS. 5B and 6B, a contact spacer 36 is next formed. The contact spacer 36 is formed on the first spacer 32 of the device using techniques known and used in the art, i.e. deposition of the spacer material and anisotropic plasma etching. The contact spacer material may be a dielectric material such as silicon nitride or silicon dioxide. In the preferred embodiment, the spacer is formed of silicon nitride. The contact spacer 36 may also be a composite spacer comprising a plurality of layers such as a silicon nitride layer overlying a silicon oxide layer. The width $X_c$ of the contact spacer 36, shown in FIG. 3B, is in the range between about 20 angstroms to about 5000 angstroms. Next, as shown in FIGS. 5C and 6C, a passivation layer 74 is deposited. The passivation layer 74 may be formed of a dielectric such as silicon oxide. For example, silicon oxide can be deposited by low pressure chemical vapor deposition using tetraethosiloxane (TEOS) as a precursor in a temperature range between about 650 degrees Celsius and about 900 degrees Celsius. The thickness of the passivation layer 74 is between about 500 angstroms and about 300 angstroms. Selected portions of the passivation layer 74 are etched to form contact holes 44,46 in the passivation layer. Etching may be accomplished in a reactive plasma etcher using a reactant gas mixture such as carbon tetrafluoride and hydrogen. Contact holes 44,46 may overlap the contact spacers 36, as shown in the enlarged, plane view of FIG. 6C. Contact holes 44,46 are then filled with an electrically conductive material. The electrically conductive material may be a metal such as tungsten, a metallic nitride such as titanium nitride and tantalum nitride, or any other electrically conducting materials. The contact holes 44,46 may also be filled with a combination of the above mentioned materials.

In the above illustration, a self-aligned contact scheme was described for an ultra-thin body transistor 70. The use of a contact spacer 36 for the self-aligned contacts 24,26 may be applied in other advanced transistor structures such as double-gate transistors, triple-gate transistors, and omega-FETs.

Figure 7:
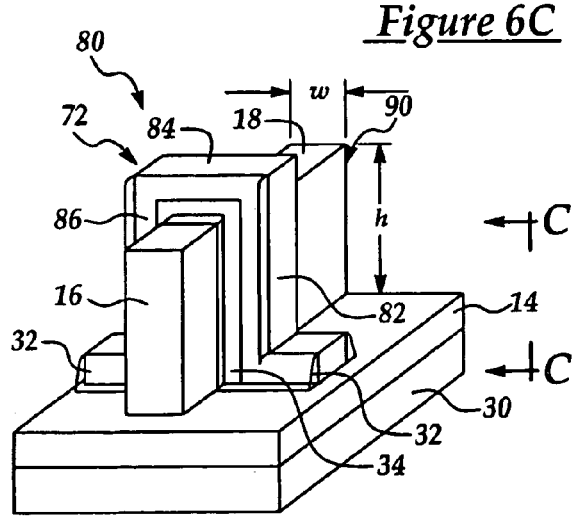
FIG. 7 is an enlarged, perspective view of a present invention triple-gate transistor prior to the formation of the self-aligned contact.
Figure 8:
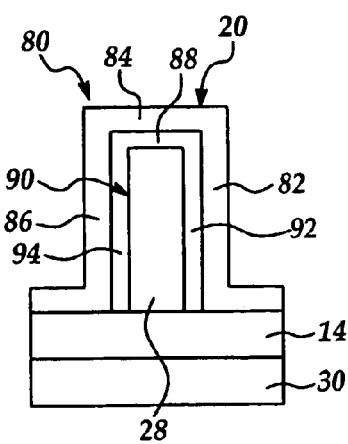
FIG. 8 is an enlarged, cross-sectional view taken along line C–C' of FIG. 7 through the gate electrode.

Referring now to FIG. 7, a triple-gate transistor 80 is shown. The triple-gate transistor 80 of FIG. 7 is completed up to the process step prior to contact formation. The triple-gate transistor 80 has a source 16 and drain 18 separated by a gate stack 72. The source/drain regions 16,18 may be formed of a silicide (not shown) and a heavily-doped source/drain (similar to the ultra-thin body transistor). FIG. 8 shows an enlarged, cross-section view of the triple-gate transistor 80 of FIG. 7 in the line containing C–C'. The line containing C–C' of FIG. 7 cuts through all three gates 82,84,86 of the gate electrode 20 as well as the channel region 28. Referring to FIG. 8, a gate dielectric layer 34 wraps around the silicon fin 90 in the channel region 28 of the triple-gate transistor 80. The gate electrode 20 in the triple-gate transistor 80 straddles over the silicon fin 90. The gate electrode 20 forms three gates: one gate 84 on the top surface 88 of the silicon fin 90, and two gates 82,86 on the sidewalls 92,94 of the silicon fin 90.

Figure 9A:
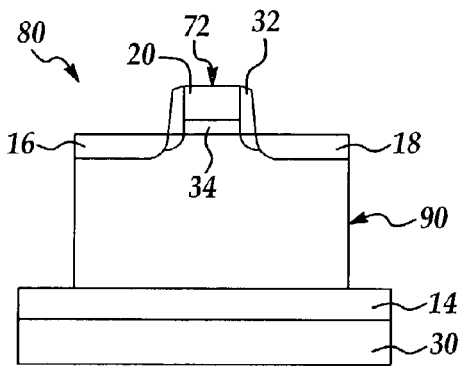
FIGS. 9A–9D are enlarged, cross-sectional views taken along line D–D' illustrating the process steps for forming the present invention self-aligned contact to a triple-gate transistor.
Figure 10A:
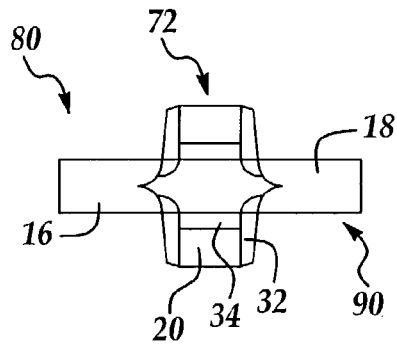
FIGS. 10A–10D are enlarged, cross-sectional views taken along line E–E' illustrating the process steps for forming a self-aligned contact in a triple-gate transistor.

An enlarged, cross-sectional view taken along line D–D' of FIG. 7 is shown in FIG. 9A. This cross-section cuts through the fin 90 and the top gate 84. The cross-section in the line containing E–E' of FIG. 7 is shown in FIG. 10A. This cross-section cuts through the fin 90 and the two gates 82,86 on the sidewalls 92,94 of the fin 90. It should be noted that the gate electrode 20 may comprise a gate capping layer 42 overlying an electrically conductive gate material. The gate material may be comprised of poly-Si, poly-SiGe, a refractory metal such as molybdenum and tungsten, compounds such as titanium nitride, or other conducting materials.

Figure 9B:
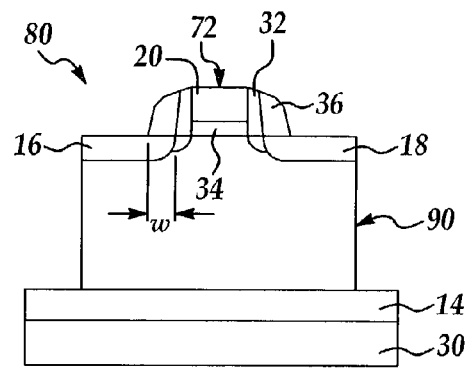
Figure 9C:
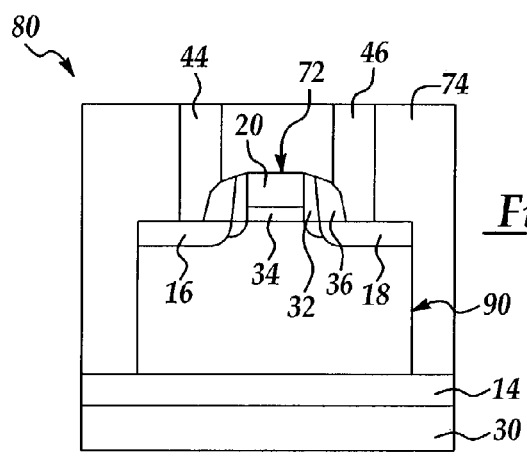
Figure 9D:
Figure 9D:
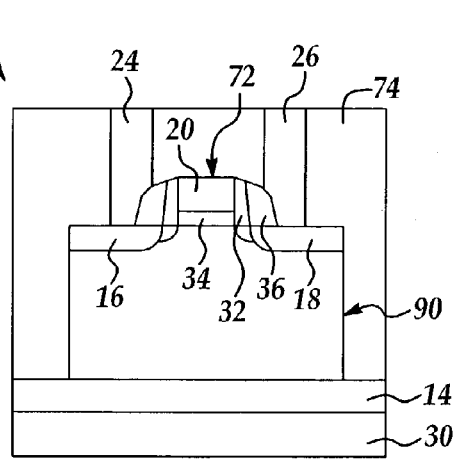
Figure 10B:
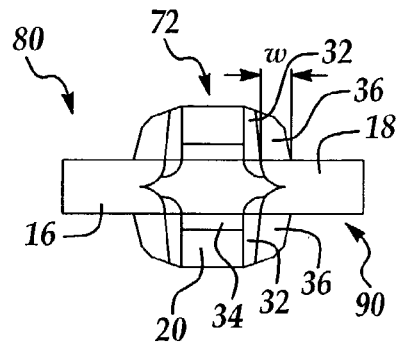
Figure 10C:
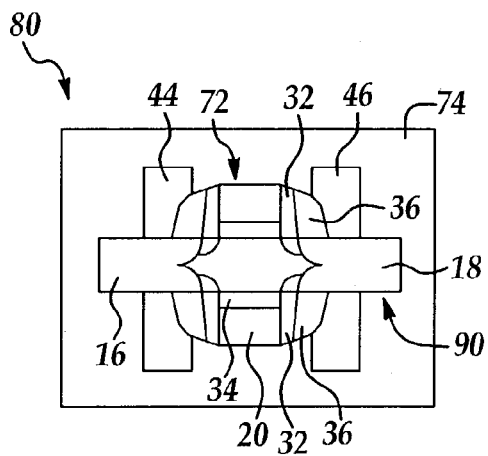
Figure 10D:
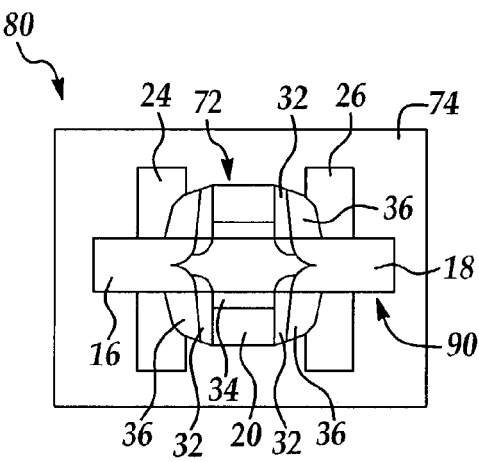

A simple process flow for fabricating the self-aligned contact for a triple-gate structure is to be described. FIGS. 9A–9D and 10A–10D illustrate the process for forming the self-aligned contacts 24,26. The method for forming a self-aligned contact begins with the completed triple-gate transistor 80 as shown in FIGS. 9A and 10A. A contact spacer 36 is formed, as shown in FIGS. 9B and 10B. The contact spacer 36 is formed using techniques known in the art for spacer formation, i.e. deposition of the spacer material and anisotropic plasma etching. The contact spacer material may be a dielectric material such as silicon nitride and silicon dioxide. In the preferred embodiment, the spacer material is a silicon nitride. The contact spacer 36 may also be a composite spacer formed by a plurality of layers such as a silicon nitride layer overlying a silicon oxide layer. The width of the contact spacer 36, shown in FIGS. 9B and 10B, is in the range from about 20 angstroms to about 5000 angstroms. This is followed by the deposition of a passivation layer 74. The passivation layer 74 may be formed of a dielectric such as silicon oxide. For example, silicon oxide can be deposited by low pressure chemical vapor deposition using tetraethosiloxane (TEOS) as a precursor at a temperature between about 650 degrees Celsius and about 900 degrees Celsius. The thickness of the passivation layer 74 is preferably in the range from about 500 angstroms to about 3000 angstroms. Selected portions of the passivation layer 74 are patterned using lithography techniques and etched to form contact holes 44,46. Etching may be accomplished in a reactive plasma etcher using a reactant gas mixture such as carbon tetrafluoride and hydrogen. Contact holes 44,46 may overlap the contact spacers 36, as shown in FIGS. 9C and 10C. Contact holes 44,46 are then filled with an electrically conductive material, as shown in FIGS. 9D and 10D. The conductive contact material may be a metal such as tungsten, a metallic nitride such as titanium nitride and tantalum nitride, or any other conducting material. The contact hole may also be filled with a combination of the above mentioned materials.

Figure 11:
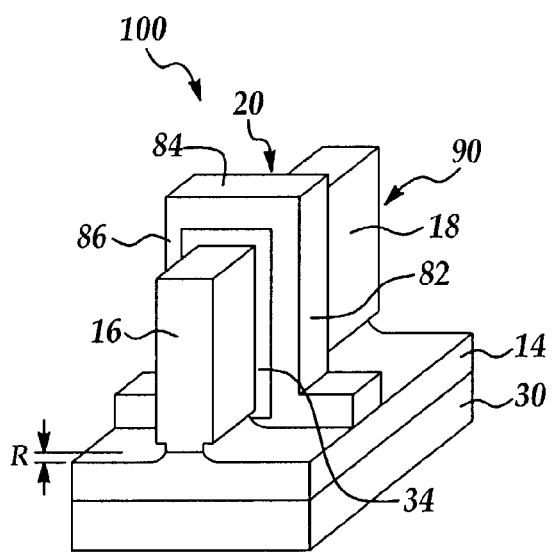
FIG. 11 is an enlarged, perspective view of an omega-FET.
Figure 12:
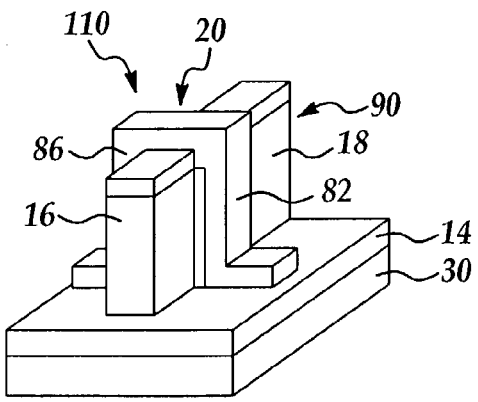
FIG. 12 is an enlarged, perspective view of a double-gate transistor.

The self-aligned contact formation process may also be applied to other advanced device structures. For example, the omega-FET structure 100 shown in FIG. 11, and the double-gate transistor structure 110 shown in FIG. 12, is similar to the triple-gate transistor structure 80. The self-aligned contact process described for the triple-gate transistor 80 may be applied generally to other multiple-gate transistors, such as the double-gate transistor 110 or the omega-FET 100.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming a self-aligned contact to a multiple-gate transistor comprising the steps of:
   providing a multiple-gate transistor comprising a source region and a drain region separated by a gate stack;
   forming a contact spacer on said gate stack;
   forming a passivation layer overlying said multiple-gate transistor;
   forming a contact hole in said passivation layer exposing said contact spacer and said source/drain region; and
   filling said contact hole with an electrically conductive material for establishing electrical communication with said source/drain region.

2. The method of claim 1 further comprising the step of providing said multiple-gate transistor in a double-gate transistor.

3. The method of claim 1 further comprising the step of providing said multiple-gate transistor in a triple-gate transistor.

4. The method of claim 1 further comprising the step of providing said multiple-gate transistor in an omega field-effect transistor.

5. The method of claim 1, wherein a gate electrode of said gate stack comprises a gate material selected from the group consisting of poly-crystalline silicon and poly-crystalline silicon-germanium.

6. The method of claim 1, wherein a gate electrode of said gate stack comprises a gate material that is a refractory metal.

7. The method of claim 1, wherein said gate stack comprises a gate electrode and a gate capping layer.

8. The method of claim 7, wherein said gate capping layer comprises a dielectric.

9. The method of claim 7, wherein said gate capping layer comprises silicon nitride.

10. The method of claim 7, wherein said gate capping layer comprises a silicon nitride layer overlying a silicon oxide layer.

11. The method of claim 1, wherein said contact spacer comprises a dielectric.

12. The method of claim 1, wherein said contact spacer comprises silicon nitride.

13. The method of claim 1, wherein said contact spacer is a composite spacer.

14. The method of claim 1, wherein said contact spacer has a width between about 20 angstroms and about 5000 angstroms.

15. The method of claim 1, wherein said passivation layer comprises silicon oxide.

16. The method of claim 1, wherein said passivation layer has a thickness in the range between about 500 angstroms and about 3000 angstroms.

17. The method of claim 1, wherein said electrically conductive material includes tungsten.

18. The method of claim 1, wherein said electrically conductive material is a nitride selected from the group consisting of titanium nitride and tantalum nitride.

19. A self-aligned contact device comprising:
   a multiple-gate transistor comprising a source and a drain separated by a gate stack;
   a contact spacer formed on the side of the gate stack; and
   an electrically conductive contact in contact with said contact spacer and in electrical communication with said source and drain.

20. The device of claim 19, wherein said multiple-gate transistor is a double-gate transistor.

21. The device of claim 19, wherein said multiple-gate transistor is a triple-gate transistor.

22. The device of claim 19, wherein said multiple-gate transistor is an omega field-effect transistor.

23. The device of claim 19, wherein a gate electrode of said gate stack comprises a material selected from the group consisting of poly-crystalline silicon and poly-crystalline silicon-germanium.

24. The device of claim 19, wherein a gate electrode of said gate stack comprises a refractory metal.

25. The device of claim 19, wherein said gate stack comprises a gate electrode and a gate capping layer.

26. The device of claim 25, wherein said gate capping layer comprises a dielectric.

27. The device of claim 25, wherein said gate capping layer comprises silicon nitride.

28. The device of claim 25, wherein said gate capping layer comprises a silicon nitride layer overlying a silicon oxide layer.

29. The device of claim 19, wherein said contact spacer comprises a dielectric.

30. The device of claim 19, wherein said contact spacer comprises silicon nitride.

31. The device of claim 19, wherein said contact spacer is a composite spacer.

32. The device of claim 19, wherein said contact spacer has a width between about 20 angstroms and about 5000 angstroms.

33. The device of claim 19, wherein said electrically conductive contact is formed of tungsten.

34. The device of claim 19, wherein said electrically conductive contact is formed of a nitride selected from the group consisting of titanium nitride and tantalum nitride.

* * * * *